United States Patent
Saive

(10) Patent No.: US 12,401,319 B2
(45) Date of Patent: Aug. 26, 2025

(54) PHOTOVOLTAIC SOLAR POWER PLANT ASSEMBLY COMPRISING AN OPTICAL STRUCTURE FOR REDIRECTING LIGHT

(71) Applicant: UNIVERSITEIT TWENTE, Enschede (NL)

(72) Inventor: Rebecca Saive, Enschede (NL)

(73) Assignee: UNIVERSITEIT TWENTE, Enschede (NL)

( * ) Notice: Subject to any disclaimer, the term of this patent is extended or adjusted under 35 U.S.C. 154(b) by 117 days.

(21) Appl. No.: 17/782,983

(22) PCT Filed: Dec. 4, 2020

(86) PCT No.: PCT/NL2020/050757
§ 371 (c)(1),
(2) Date: Jun. 6, 2022

(87) PCT Pub. No.: WO2021/112677
PCT Pub. Date: Jun. 10, 2021

(65) Prior Publication Data
US 2023/0025035 A1      Jan. 26, 2023

Related U.S. Application Data

(60) Provisional application No. 62/985,450, filed on Mar. 5, 2020, provisional application No. 62/943,369, filed on Dec. 4, 2019.

(51) Int. Cl.
H02S 40/22      (2014.01)

(52) U.S. Cl.
CPC .................................. *H02S 40/22* (2014.12)

(58) Field of Classification Search
CPC ....... H02S 40/20; H02S 40/22; H01L 31/055; H01L 31/056
See application file for complete search history.

(56) References Cited

U.S. PATENT DOCUMENTS

| 2009/0217977 A1 | 9/2009 | Florescu et al. ............... 136/256 |
| 2009/0283133 A1 | 11/2009 | Hebrink et al. ............... 136/246 |

(Continued)

FOREIGN PATENT DOCUMENTS

| EP | 3036775 | 10/2020 | ........... H01L 31/055 |
| WO | WO 2007/012026 | 1/2007 | ........... H01L 31/052 |
| WO | WO 2012/154793 | 11/2012 | ........... H01L 31/052 |

OTHER PUBLICATIONS

International Search Report and Written Opinion issued in PCT/NL2020/050757, dated Nov. 17, 2021, 15 pages.

(Continued)

*Primary Examiner* — Daniel P Malley, Jr.
(74) *Attorney, Agent, or Firm* — HAYES SOLOWAY P.C.

(57) ABSTRACT

A photovoltaic solar power plant assembly and a method of using said assembly to generate power are disclosed. The assembly includes an array of photovoltaic solar modules arranged in a solar module surface, and an optical structure for redirecting light towards said solar module surface, having a redirected light emitting surface. The optical structure includes: a planar optical waveguide which has a parallel first and second planar waveguide surfaces, wherein the first planar waveguide surface extends parallel to the redirected light emitting surface, wherein the first planar waveguide surface is at least partially covered by a photonic layer which is configured to provide an angular restriction of a light emission from the planar waveguide through the redirected light emitting surface, and a light scattering and/or luminescent material, which material is arranged as particles in the planar optical waveguide and/or in a layer which at least partially covers the second planar waveguide surface.

16 Claims, 8 Drawing Sheets

(56) References Cited

U.S. PATENT DOCUMENTS

| | | | | |
|---|---|---|---|---|
| 2012/0037217 A1* | 2/2012 | Hamam | ................. | B82Y 20/00 |
| | | | | 136/259 |
| 2014/0083482 A1* | 3/2014 | Hebrink | ................. | H02S 40/22 |
| | | | | 136/246 |
| 2014/0230884 A1 | 8/2014 | Shapira et al. | ............... | 136/247 |
| 2016/0276501 A1* | 9/2016 | Wassvik | ................. | H10F 77/45 |

OTHER PUBLICATIONS

International Preliminary Report on Patentability issued in PCT/NL2020/050757, dated May 17, 2022, 10 pages.
Einhaus et al., Free-Space Concentration of Diffused Light for Photovoltaics, Conference Paper, www.researchgate.net/publication/342917247, Jul. 2020.

\* cited by examiner

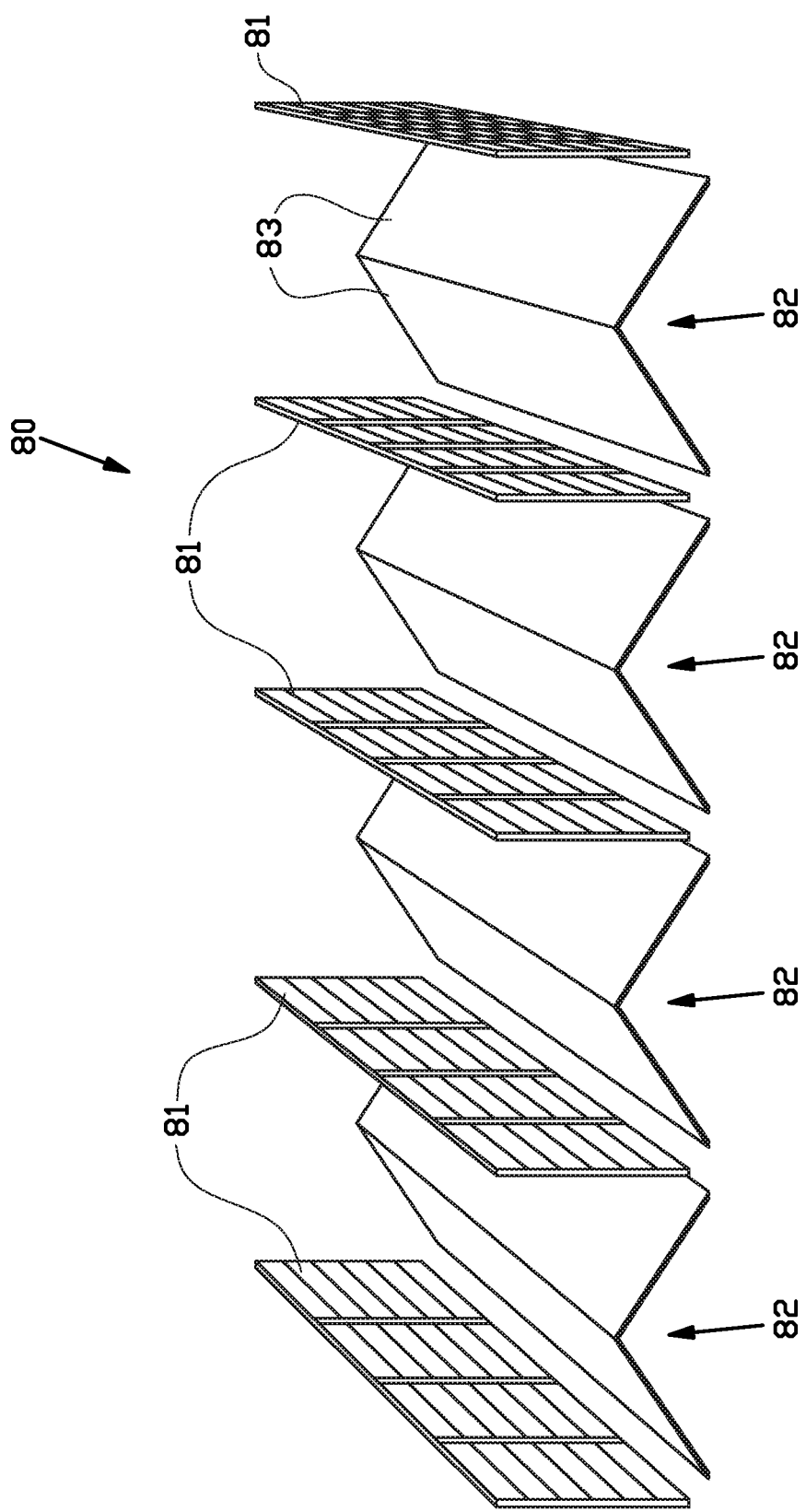

PHOTOVOLTAIC SOLAR POWER PLANT ASSEMBLY COMPRISING AN OPTICAL STRUCTURE FOR REDIRECTING LIGHT

BACKGROUND

The invention relates to a photovoltaic solar power plant assembly, an optical structure for redirecting light for use in such a photovoltaic solar power plant assembly, and a method for converting solar energy into electrical power using such a photovoltaic solar power plant assembly.

Photovoltaic solar cells are used to convert solar energy, in the form of sun light, which impinges onto the solar cells, into electrical power. A relatively new development is the use of bifacial photovoltaic solar cells which are able to absorb sun light at both opposite surfaces of the solar cells, for example at a front surface and a rear surface of the solar cells.

In case the front surface is directed towards the sun, the power output of bifacial photovoltaic solar cells can be greatly increased by providing, at a side of the bifacial photovoltaic solar cells facing away from the sun, a ground material, which has a high diffuse reflection of the solar radiation, also denoted as having a high albedo. The sun light reflected from said ground material can be received by the rear surface of the bifacial photovoltaic solar cells, which can convert this reflected light also into electrical power, and thereby increase the power output of the photovoltaic solar cells.

In an alternative setup of a photovoltaic solar power plant uses a fixed vertical installation of bifacial photovoltaic solar cells, wherein the two side are facing East and West. This provide a peak in energy generation during the mid-morning and the mid-afternoon, providing a more favorable generated energy distribution when compared with mono-facial photovoltaic solar cells facing South. Due to the fixed vertical mounting, such a photovoltaic solar power plant can be combined agricultural usage of the area in between the vertically mounted bifacial photovoltaic solar cells, as introduced by the firm Next2Sun GmbH.

SUMMARY OF THE INVENTION

A disadvantage of the known photovoltaic solar power plants is that they mainly relate to the generation of electrical energy by direct irradiation of the photovoltaic solar cells by sun light. Even when using ground materials to increase the power output, the ground materials are arranged to convert the impinging sun light into more or less diffuse reflected light, of which only a fraction reaches the photovoltaic solar cells.

However, in overcast areas, the amount of direct sun light is strongly reduced and the available sun light is predominantly diffuse sun light.

It is an object of the present invention to provide a photovoltaic solar power plant, which allows to provide a higher yield when converting diffuse sun light into electrical power.

According to a first aspect, the present provides a photovoltaic solar power plant assembly comprising an array of photovoltaic solar modules arranged in a photovoltaic solar module surface, and an optical structure for redirecting light comprising a redirected light emitting surface, wherein the optical structure for redirecting light comprises:

- a planar optical waveguide, wherein the planar optical waveguide comprises a first and second planar waveguide surface which are substantially parallel to each other and a circumferential edge, wherein said first planar waveguide surface extends substantially parallel to said redirected light emitting surface, wherein said first planar waveguide surface is at least partially covered by a photonic layer, wherein said photonic layer is configured to provide an angular restriction of a light emission from the planar waveguide through said redirected light emitting surface, and
- a light scattering and/or luminescent material, which material is arranged as particles in the planar optical waveguide and/or in a layer which at least partially covers said second planar waveguide surface, wherein the photovoltaic solar module surface and the redirected light emitting surface are arranged so that the redirected light emitting surface is facing the photovoltaic solar module surface.

Accordingly, the photovoltaic solar power plant of the present invention is provided with an optical structure for redirecting light towards photovoltaic solar cells of the photovoltaic solar modules, wherein said optical structure comprises a planar optical waveguide as described above.

When considering a planar optical waveguide without a photonic layer, light coming from every direction within a hemisphere above the first planar waveguide surface may enter into the material of the waveguide. Light from inside the planar optical waveguide may exit the waveguide via the first planar waveguide surface, as long as the angle of incident of the light beam onto the first planar waveguide surface is smaller than the critical angle. Accordingly, any light beam inside the waveguide, which is directed to the first planar waveguide surface at an angle below the critical angle, can exit the first planar waveguide surface, which defines an 'escape cone' of all angles of incident smaller than the critical angle. All light beams with an angle of incident inside said 'escape cone' can provide light beams outside the waveguide with an angle of refraction which covers the complete hemisphere above the first planar waveguide surface. Any light beam inside the waveguide, which is directed to the first planar waveguide surface at an angle larger than the critical angle, is totally reflected by the first planar waveguide surface and is trapped inside said planar waveguide.

According to the invention, the first planar waveguide surface of the planar waveguide is at least partially covered by a photonic layer, wherein photonic layer is configured to provide an angular restriction of a light emission from the planar waveguide through said first planar waveguide surface. The photonic layer is essentially configured to reflect light beams in a certain range of angles of incident adjacent to and smaller than the original critical angle, which light beams could exit the waveguide if the photonic layer is not present. Accordingly, the photonic layer is configured to narrow down the escape cone. This also increases the photon density inside the waveguide.

As described above, the photonic layer is configured to provide a narrowed escape cone. The inventor has realized that all light beams with an angle of incident inside said narrowed escape cone can provide light beams outside the waveguide with an angle of refraction which covers only a part of the hemisphere above the first planar waveguide surface, which part of the hemisphere defines an 'escape cone'. Accordingly, the photonic layer is configured to provide an angular restriction of a light emission from the planar waveguide through said first surface, which is also denoted herein as the redirected light emitting surface.

In addition, the optical structure comprises a light scattering and/or luminescent material, which material is arranged as particles in the planar optical waveguide and/or in a layer, which at least partially covers said second planar waveguide surface. One function of this material is to scatter or disperse the light inside the planar waveguide and in particular to scatter or disperse the light that is trapped inside the planar waveguide, so that after this trapped light is scattered or dispersed it may reach the first planar waveguide surface at an angle which allows this light to exit the waveguide. Accordingly, the light scattering and/or luminescent material assists in freeing the light trapped inside said planar waveguide so that it can also exit the waveguide within said escape cone.

The combination of photonic layer and a planar waveguide provides an angular restriction of a light emission from the planar waveguide to light beams with an angle of refraction within said escape cone. In addition, the light scattering and/or luminescent material, inter alia, allows scattering or dispersing the light trapped inside said planar waveguide so that it at least partially can contribute to the light emitted from the planer waveguide. Accordingly, the optical structure of the present invention can provide a more concentrated light output, which can be projected onto the photovoltaic solar cells of the photovoltaic solar power plant, which allows to provide a higher yield.

It is noted that herein the term 'planar optical waveguide' and 'planar waveguide surface' is not limited to two-dimensional flat surfaces or waveguides, but also includes surfaces or waveguides which are curved in a three-dimensional space.

It is further noted that herein the terms 'angle of incident' and 'angle of refraction' are defined as the angle between the light beam or light rays and a normal to the interface, for example, the first planar waveguide surface between the planar waveguide and a medium adjacent the planar waveguide.

In an embodiment, the photonic layer comprises a dielectric surface coating, preferably wherein the dielectric surface coating comprises one or more high refractive index materials. In an embodiment, the dielectric surface coating comprises a dielectric thin film stack. Dielectric thin film structures, in particular a dielectric thin film stack, offer a lot of freedom for the optimization of the angle-selective emission from the first surface of the planar waveguide. In an embodiment, the dielectric surface coating is configured to provide a low reflectivity for light inside said planar waveguide with an angle of incidence on the dielectric surface coating below 50 degrees, preferably below 45 degrees, more preferably below 25 degrees.

It is noted, that said reflectivity is usually rotational symmetric around an axis perpendicular to the interface at which the reflection or refraction occurs. Accordingly, the assembly of refracted light beams defines a cone with a circular cross-section with the axis in the center of the circular cross-section.

However, in an embodiment, the photonic layer is configured such that the reflectivity is not the same for all directions in the plane of the waveguide. In this situation, the assembly of refracted light beams defines a cone with an elliptical cross-section with the axis in the center of the elliptical cross-section.

Furthermore, in an embodiment, the photonic layer is configured such that a central axis around which the cone of refracted light beams exit the waveguide is tilted with respect to the planar waveguide, preferably wherein said central axis is arranged at an angle smaller than 90 degrees with respect to the interface at which the refraction occurs. In an embodiment, the photonic layer is further configured to provide an assembly of refracted light beams, which define a cone with a circular cross-section with the tilted central axis in the center of the circular cross-section. In an embodiment, the photonic layer is further configured to provide an assembly of refracted light beams, which define a cone with an elliptical cross-section with the tilted central axis in the center of the circular cross-section.

It is noted that in addition or alternatively, the reflection/emission control of the photonic layer may also be obtained by a photonic layer, which comprises plasmonic resonators and/or dielectric photonic crystals.

In addition to providing an angle-selective emission, dielectric thin film structures, in particular a dielectric thin film stack, can be optimized in order to allow a transmission for light with a short wavelength, for example blue light, and to provide an angular restriction for light with a longer wavelength, for example red light. In an embodiment, the dielectric surface coating is configure to provide a low reflectivity for light with a wavelength below a predetermined wavelength, and preferably to provide an angular restriction for light inside said planar waveguide with a wavelength above said predetermined wavelength. Preferably, said predetermined wavelength is a wavelength in a range from (and including) 700 to 900 nm. Such a dielectric surface coating is particularly useful in combination with a suitable luminescent material or suitable quantum dots.

In an embodiment, the luminescent material is configured to emit light with a wavelength above 700 nm when irradiated with sun light, preferably to emit light in a wavelength ranged from 700 to 1200 nm, preferably the luminescent material is configured to absorb light with a wavelength below 700 nm.

In an embodiment, the light scattering and/or luminescent material comprises quantum dots, nanocrystals, dyes and/or pigments, preferably wherein the quantum dots, nanocrystals, dyes and/or pigments are configured to provide a large Stokes shift. In an embodiment, the quantum dots are configured to emit light with a wavelength above 700 nm when irradiated with sun light, preferably to emit light in a wavelength ranged from 700 to 1200 nm, preferably the quantum dots are configured to absorb light with a wavelength below 700 nm.

When one or more of the luminescent material, quantum dots, nanocrystals, dyes and/or pigments, is combined with the dielectric surface coating as described and suggested above, the dielectric surface coating is substantially transparent for light with a wavelength below 700 nm, and sun light with a wavelength below 700 nm coming from substantially all directions in the hemisphere above the first planar waveguide surface can, at least partially, enter the planar waveguide. Inside said planar waveguide the light with a wavelength below 700 nm is, at least partially, converted into light with a wavelength above 700 nm by the luminescent material, quantum dots, nanocrystals, dyes and/or pigments, for example. Since the dielectric surface coating is substantially reflective for light with a wavelength above 700 nm and with an angle of incident below an emission angle defined by the dielectric surface coating, which emission angle is smaller than the critical angle of the planar waveguide without the dielectric surface coating, the dielectric surface coating provides an angular restriction for light inside said planar waveguide with a wavelength above 700 nm.

It is noted that the optimization of the dielectric surface coating for being substantially transparent for light with a wavelength below 700 nm and for providing an angular restriction for light with a wavelength above 700 nm is suitable for a photovoltaic solar power plants using silicon-based photovoltaic solar cells. When using photovoltaic solar cells with other light absorption properties the predetermined wavelength below which the dielectric surface coating is substantially transparent may be configured at a different wavelength than 700 nm, for example a wavelength in a range from about 600 nm up to and including 900 nm.

In an embodiment, the light scattering and/or luminescent material is only arranged as particles in the planar optical waveguide. Preferably, the photonic layer is a first photonic layer, and wherein the optical structure for redirecting light comprises a second photonic layer which is arranged at said second planar waveguide surface of the planar optical waveguide, wherein said second photonic layer is configured to provide an angular restriction of light emission from the planar waveguide. The optical structure for redirecting light according to this embodiment can be used in transmission, and the first planar waveguide surface is facing towards the photovoltaic solar modules in order to project the concentrated light onto the photovoltaic solar cells of the photovoltaic solar modules, whereas the second planar waveguide surface is facing away from the photovoltaic solar modules and is configured collecting direct and/or diffuse sun light.

In case the optical structure of the latter embodiment would require a rigid carrier, it is preferred that this rigid carrier is substantially transparent. When the rigid carrier is arranged adjacent to the first planar waveguide surface, the rigid carrier is preferably transparent for sun light. When the rigid carrier is arranged adjacent to the second planar waveguide surface, the rigid carrier is preferably transparent for the light emitted by the luminescent material of the light scattering material such as the quantum dots.

In an alternative embodiment, the light scattering and/or luminescent material, which material is arranged in a scattering layer which at least partially covers said second planar waveguide surface, preferably said scattering layer is configured to provide a diffuse reflection of light back into the waveguide. Preferably, said scattering layer is configured to provide a substantially Lambertian reflector. The optical structure for redirecting light according to this embodiment can be used in reflection, and the first planar waveguide surface is facing towards the photovoltaic solar modules in order to project the concentrated light onto the photovoltaic solar cells of the photovoltaic solar modules, and in addition the first planar waveguide surface is configured collecting direct and/or diffuse sun light.

In case the optical structure of the latter embodiment would require a rigid carrier, this rigid carrier is preferably arranged adjacent to the second planar waveguide surface. In this case, the rigid carrier does not need to have some special optical properties.

In an embodiment, the optical structure for redirecting light comprises a reflective coating, which is arranged to at least partially cover the second planar waveguide surface of the planar wave-guide and/or to at least partially cover the circumferential edge of the planar wave-guide.

In an embodiment, the optical structure for redirecting light comprises a lens array, which is arranged such that the redirected light emitting surface is arranged in between the planar optical waveguide, and the lens array, preferably wherein the lens array is configured to concentrate the redirected light onto photovoltaic solar modules. Such a lens array is particularly suitable in combination with an optical structure for redirecting light, which is configured to be used in transmission.

In an embodiment, the light scattering material comprises:
organic or inorganic diffusers, preferably comprising barium sulfate, zinc oxide, titanium oxide and/or high refractive index materials,
quantum dots,
nanocrystals,
dyes and/or pigments, and/or
nano or micro textures.

In addition, the present invention provides a photovoltaic solar power plant assembly comprising an array of photovoltaic solar modules arranged in a photovoltaic solar module surface, and an optical structure for redirecting light comprising a redirected light emitting surface,
wherein the optical structure for redirecting light comprises a substantially rigid carrier and a diffuse reflective layer which extend substantially parallel to or along said redirected light emitting surface,
wherein the photovoltaic solar module surface and the redirected light emitting surface are arranged so that the redirected light emitting surface is facing the photovoltaic solar module surface and wherein the photovoltaic solar module surface and the redirected light emitting surface are arranged to enclose an acute angle.

Accordingly, the optical structure for redirecting light comprises a substantially rigid carrier, which can be sculptured in a certain shape and/or mounted in a certain position with respect to the photovoltaic solar modules to enhance the power yield of the photovoltaic power plant. Preferably, the mounting of the optical structure for redirecting light is such that the redirected light emitting surface is arranged at an acute angle with respect to the photovoltaic solar module surface, preferably wherein said angle is in a range between 30 and 60 degrees, preferably said angle is approximately 45 degrees.

This optical structure for redirecting light can suitable be combined with vertically mounted solar modules, preferably vertically mounted bifacial solar modules, to form the photovoltaic solar power plant assembly.

In an embodiment, the diffuse reflective layer comprises:
organic or inorganic diffusers, preferably comprising barium sulfate, zinc oxide, titanium oxide and/or high refractive index materials,
quantum dots,
nanocrystals,
dyes or pigments, and/or
nano or micro textures.

It is noted that all of the above embodiments can be combined with a substantially rigid carrier. Preferably, said substantially rigid carrier comprises a polymer material, preferably comprising one or more of polytetrafluoroethylene (PTFE), polyethylene, polypropylene, polystyrene, polyvinyl-chloride, and polyurethane. These readily available and relatively inexpensive materials, which can easily be sculptured in a desired shape, allow to easily and relatively cheaply produce the optical structures for redirecting light.

It is further noted that all of the above embodiment can also be provided with an anti-soiling surface. Preferably, at least said redirected light emitting surface comprises said anti-soiling surface. Preferably, said anti-soiling surface comprises a hydrophobic surface, wherein said hydrophobic surface preferably comprises a coating of fluorinated polymers and/or hydrophobic nanostructures.

According to a second aspect, the present invention provides an optical structure for redirecting light towards photovoltaic solar cells of a photovoltaic solar module of a photovoltaic solar power plant assembly, wherein the optical structure for redirecting light comprises:

a planar optical waveguide, wherein the planar optical waveguide comprises a first and second planar waveguide surface which are substantially parallel to each other and a circumferential edge, wherein said first planar waveguide surface extends substantially parallel to said redirected light emitting surface, wherein said first planar waveguide surface is at least partially covered by a photonic layer, wherein said photonic layer is configured to provide an angular restriction of a light emission from the planar waveguide through said redirected light emitting surface, and a light scattering and/or luminescent material, which material is arranged as particles in the planar optical waveguide and/or in a layer which at least partially covers said second planar waveguide surface, wherein the optical structure comprising a mounting member for mounting said optical structure for redirecting light onto an array of photovoltaic solar modules or onto a surface adjacent and/or near to the array of photovoltaic solar modules.

According to a third aspect, the invention provides a method of converting solar energy into electrical power using a photovoltaic solar power plant assembly or an embodiment thereof as described above.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which:

FIG. 6 schematically shows a further example of using a free space luminescent solar concentrator, wherein the optical structure for redirecting light is configured to emit the concentrated light substantially from the same surface as which is configured for collecting the sun light;

DETAILED DESCRIPTION OF THE INVENTION

Figure 1:
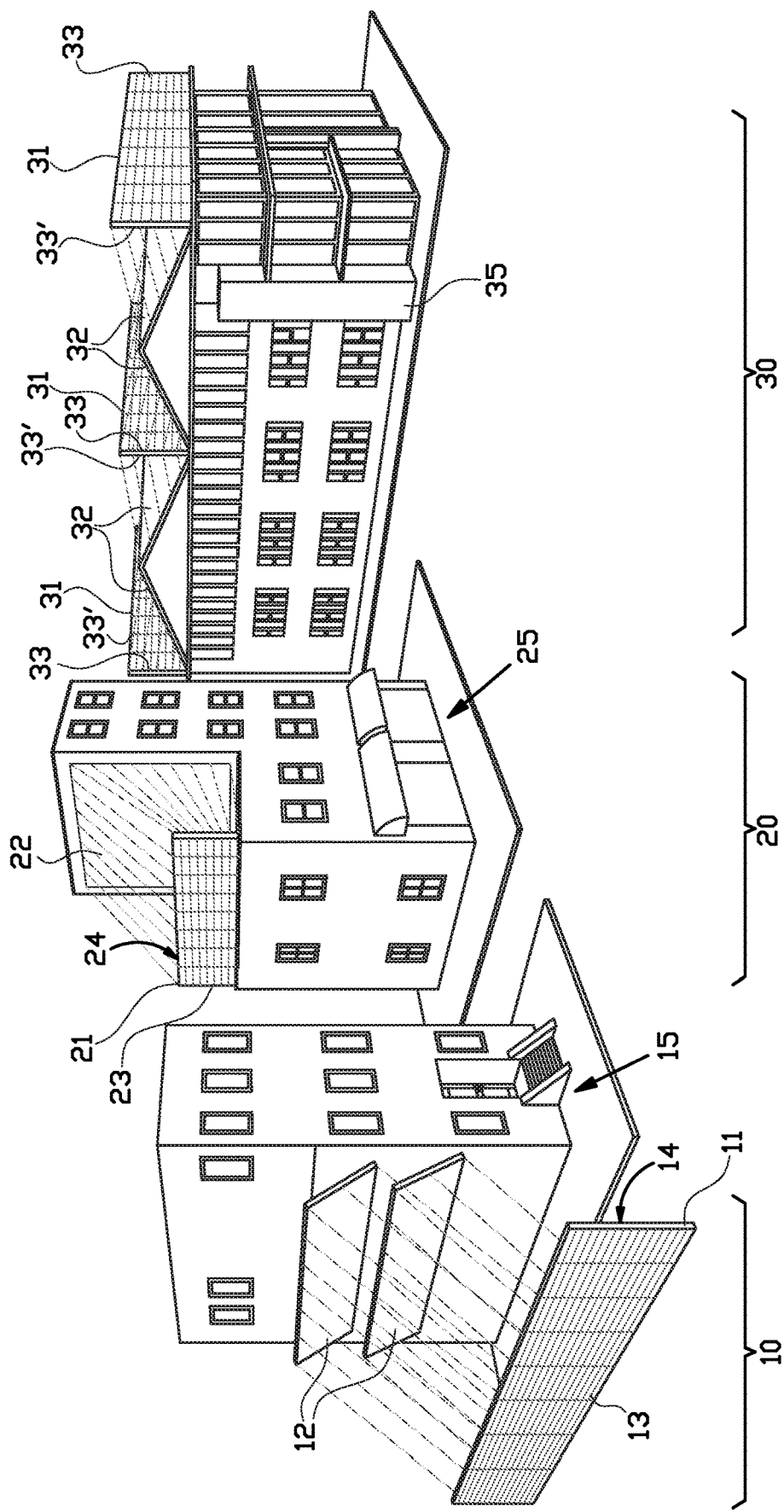
FIG. 1 shows a schematic overview of various examples of a photovoltaic solar power plant according to the invention.

FIG. 1 shows a schematic overview of various examples of a photovoltaic solar power plant according to the invention.

In a first example, the photovoltaic solar power plant 10 comprises an array of photovoltaic solar modules 11, and optical structures 12 for redirecting light. The photovoltaic solar modules 11 are vertically mounted bifacial photovoltaic solar modules having a first side 13 facing the direction where the sun is position around noon; which is due south on the Northern Hemisphere and due north of the Southern Hemisphere. Accordingly, the first side 13 of the bifacial photovoltaic solar modules is arranged to collect direct light and/or diffuse light from the sun.

As schematically shown the photovoltaic solar modules 11 are mounted on the ground adjacent a building 15. On a wall of said building 15 which is facing the photovoltaic solar modules 11, several optical structures 12 for redirecting light are mounted. The optical structures 12 allow to capture direct light and/or diffuse light from the sun, and are configured to emit at least part of the captured solar energy towards a second side 14 of the bifacial photovoltaic solar modules 11.

In a second example, the photovoltaic solar power plant 20 comprises an array of photovoltaic solar modules 21, and an optical structures 22 for redirecting light. The photovoltaic solar modules 21 are vertically mounted bifacial photovoltaic solar modules having a first side 23 facing the direction where the sun is position around noon; which is due south on the Northern Hemisphere and due north of the Southern Hemisphere. Accordingly, the first side 23 of the bifacial photovoltaic solar modules is arranged to collect direct light and/or diffuse light from the sun.

As schematically shown the photovoltaic solar modules 21 are mounted on the roof of a building 25. Furthermore, said building 25 comprises a wall which is facing the photovoltaic solar modules 21, wherein on said wall the optical structure 22 for redirecting light is mounted. The optical structures 22 allow to capture direct light and/or diffuse light from the sun, and are configured to emit at least part of the captured solar energy towards a second side 24 of the bifacial photovoltaic solar modules 21.

In a third example the photovoltaic solar power plant 30 comprises an array of photovoltaic solar modules 31, and optical structures 32 for redirecting light. The photovoltaic solar modules 31 are vertically mounted bifacial photovoltaic solar modules which are mounted in along a North-South direction. Accordingly, the Eastward facing side 33 of the photovoltaic solar modules 31 can collect direct light and/or diffuse light from the sun in the morning, and the Westward facing side 33' of the photovoltaic solar modules 31 can collect direct light and/or diffuse light from the sun in the afternoon.

As schematically shown the photovoltaic solar modules 31 are mounted on a roof of a building 35. In between the photovoltaic solar modules 31, several optical structures 32 are mounted on the same roof. The optical structures 32 allow to capture direct light and/or diffuse light from the sun, and are configured to emit at least part of the captured solar energy towards a side 33, 33' of the bifacial photovoltaic solar modules 31 adjacent to the corresponding optical structure 32.

The optical structures 12, 22, 32 for redirecting light may comprise just a diffuse reflective layer arranged on a substantially rigid carrier, which carrier may comprise a polymer material.

Preferably, the optical structures 12, 22, 32 comprise photonic material for diffused light concentration and collimation as described in more detail below.

Figure 2:
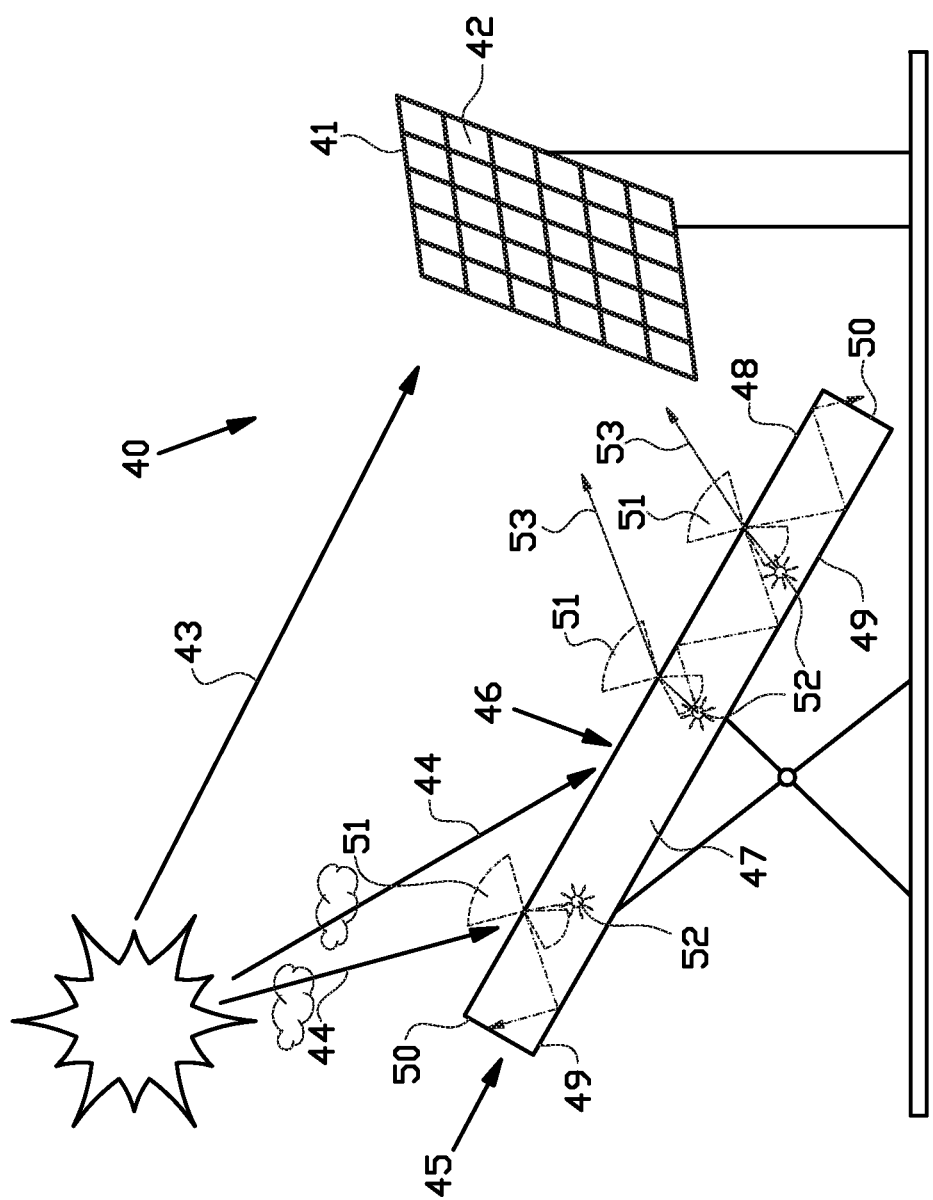
FIG. 2 schematically shows the working of an example of a photovoltaic solar power plant according to the invention.

FIG. 2 schematically shows the working of an example of a photovoltaic solar power plant assembly 40 according to the invention. Photovoltaic solar power plant assembly 40 comprising an array of photovoltaic solar modules 41 arranged in a photovoltaic solar module surface 42, and an optical structure 45 for redirecting light comprising a redirected light emitting surface 46. The optical structure 45 for redirecting light comprises a planar optical waveguide 47. The planar optical waveguide 47 comprises a first planar waveguide surface 48 and second planar waveguide surface 49 which are substantially parallel to each other and a circumferential edge 50. The first planar waveguide surface 48 extends substantially parallel to said redirected light emitting surface 46. Said first planar waveguide surface 48 is at least partially covered by a photonic layer as will be described in more detail below. Said photonic layer is configured to provide an angular restriction 51 of a light emission from the planar waveguide 47 through said redirected light emitting surface 46. In addition, the planar waveguide comprises a light scattering and/or luminescent material 52, which material is arranged as particles in the planar optical waveguide 47. In addition, the second planar waveguide surface 49 is provided with a reflecting layer, preferably a diffuse reflecting. As schematically shown in FIG. 2, both the photovoltaic solar module surface 42 and the redirected light emitting surface 46 are arranged so that they can collect direct light 43 and/or diffuse light 44 from the sun. In addition, the photovoltaic solar module surface 42 and the redirected light emitting surface 46 are arranged so that the redirected light emitting surface 46 is facing the photovoltaic solar module surface 42, so that the redirected light 53 emitted by optical structure 45 for redirecting light can be directed towards the photovoltaic solar module surface 42.

Figure 3:
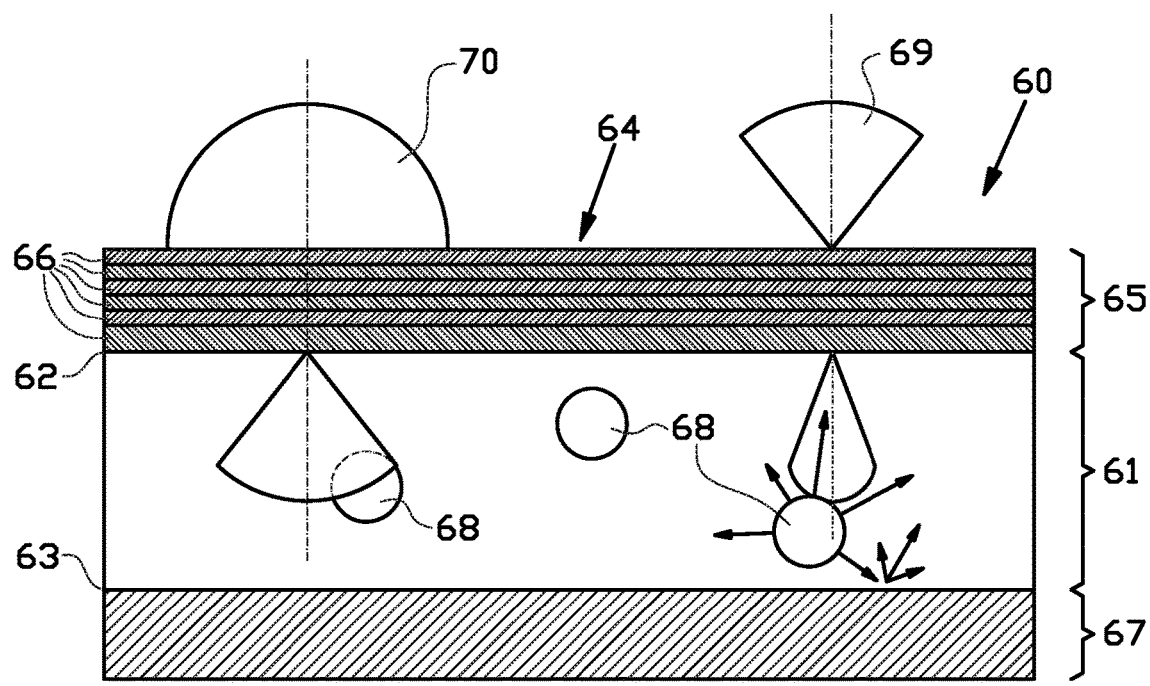
FIG. 3 shows a schematic cross-section of a first example of an optical structure for redirecting light according to the invention.

FIG. 3 shows a schematic cross-section of a first example of an optical structure 60 for redirecting light according to the invention. The optical structure 60 comprises a planar optical waveguide 61, having a first planar waveguide surface 62 and second planar waveguide surface 63 which are substantially parallel to each other. Said first planar waveguide surface 62 extends substantially parallel to a redirected light emitting surface 64.

The first planar waveguide surface 62 is covered by a photonic layer 65. The photonic layer 65 comprises a dielectric surface coating, in particular a stack of dielectric thin films 66 of two or more high refractive index materials.

The second planar waveguide surface 63 is covered by a diffuse reflective coating 67, preferably wherein the diffuse reflecting coating 67 is configured to provide a Lambertian reflector.

Inside the planar optical waveguide 61, luminescent material 68 is arranged, which luminescent material 68 of this example is configured to substantially absorb light with a wavelength below 700 nm, and to substantially emit light with a wavelength above 700 nm.

Figure 4:
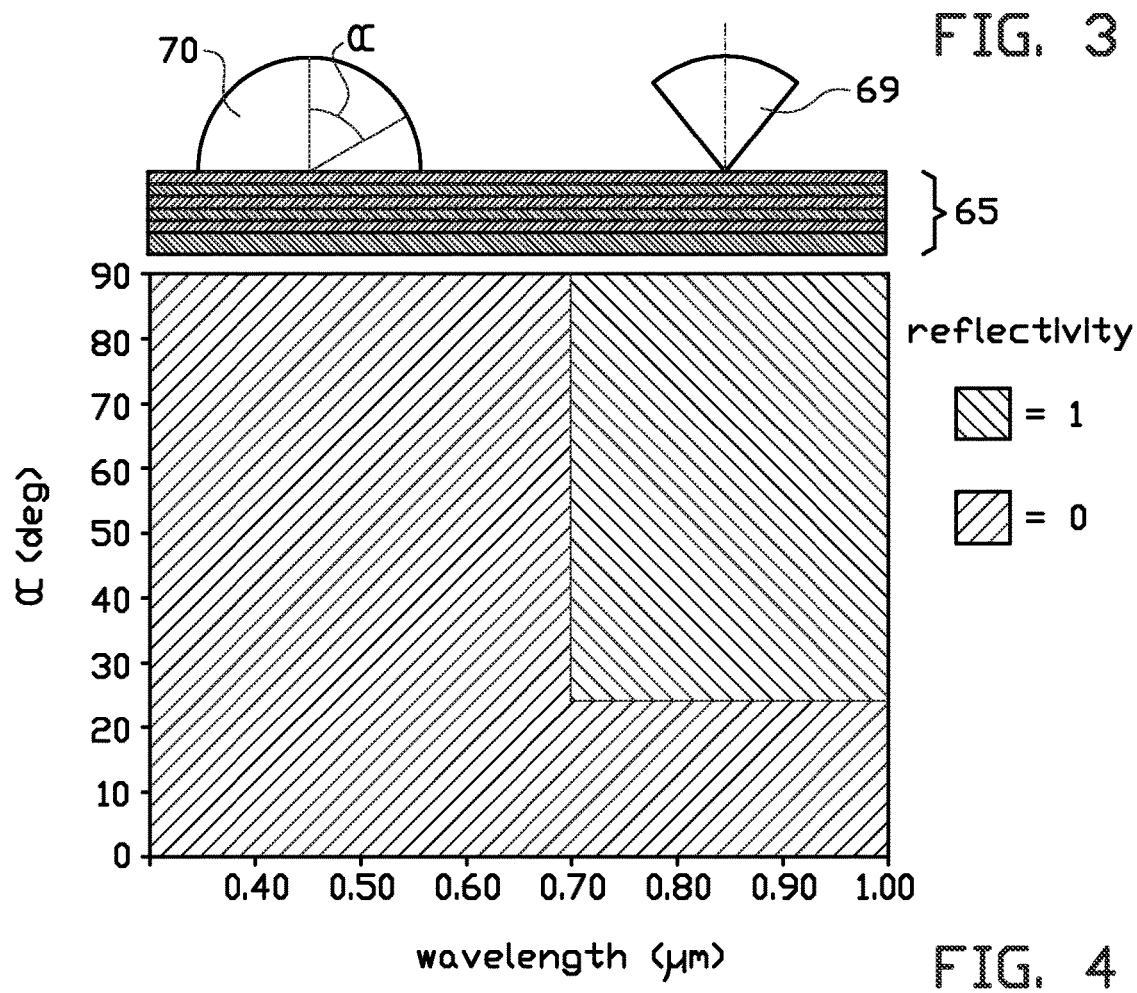
FIG. 4 shows a theoretical example of a photonic layer for use on a planar optical waveguide of FIG. 3.

FIG. 4 shows a theoretical example of a photonic layer 65 for use on a planar optical waveguide of FIG. 3. The photonic layer 65 of this theoretical example is arranged to be substantially transparent for light with a wavelength below 700 nm. In addition, the photonic layer 65 of this theoretical example is arranged to provide an angular restriction for light with a wavelength above 700 nm. In particular, for light with a wavelength above 700 nm and with an angle of incident of about 25 degrees or less, the reflectivity is low (preferably close to zero), and for light with a wavelength above 700 nm and with an angle of incident from of about 25 degrees up to 90 degrees, the reflectivity is high (preferably close to one).

Accordingly, from the light with a wavelength above 700 nm, as emitted by the luminescent material 68, the light with an angle of incident of about 25 degrees or smaller can exit the redirected light emitting surface 64, which results in angular restriction of the emitted light with a wavelength above 700 nm to the directions of the escape cone 69 as indicated in FIG. 3.

Since the photonic layer 65 is substantially transparent for light with a wavelength below 700 nm, there is no angular restriction and light with a wavelength below 700 nm coming from all directions in het hemisphere 70 above the photonic layer 65 can at least partially pass through the photonic layer 65 into the waveguide 61.

Figure 5A:
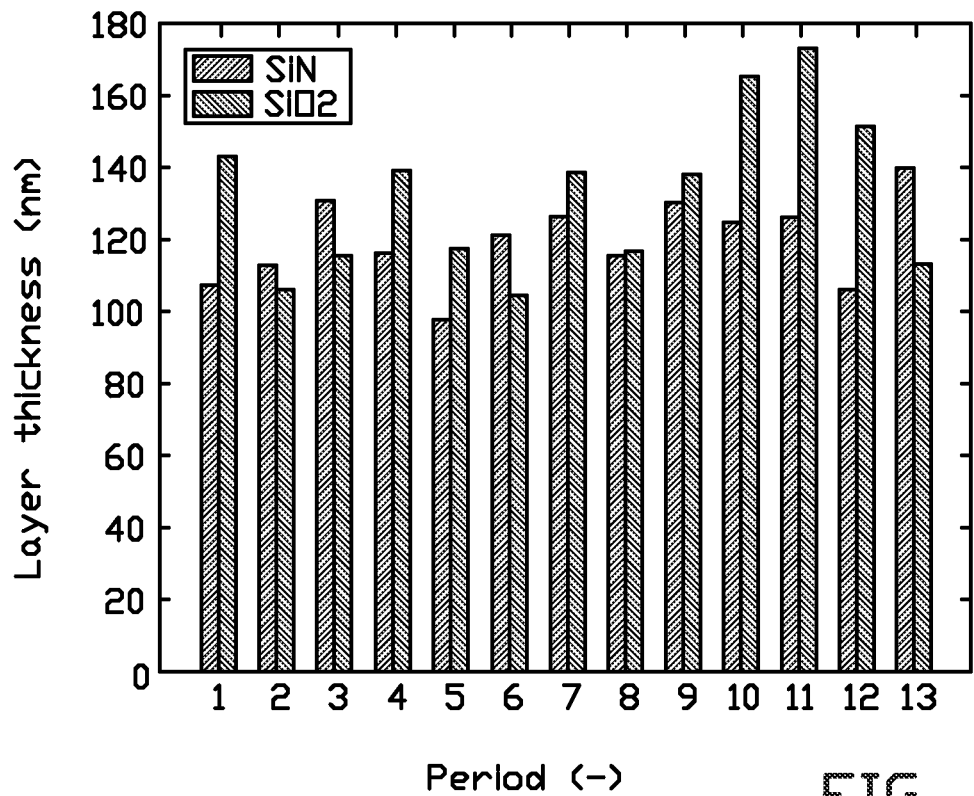
FIG. 5A shows an example a photonic layer comprising a stack of dielectric layers.
Figure 5B:
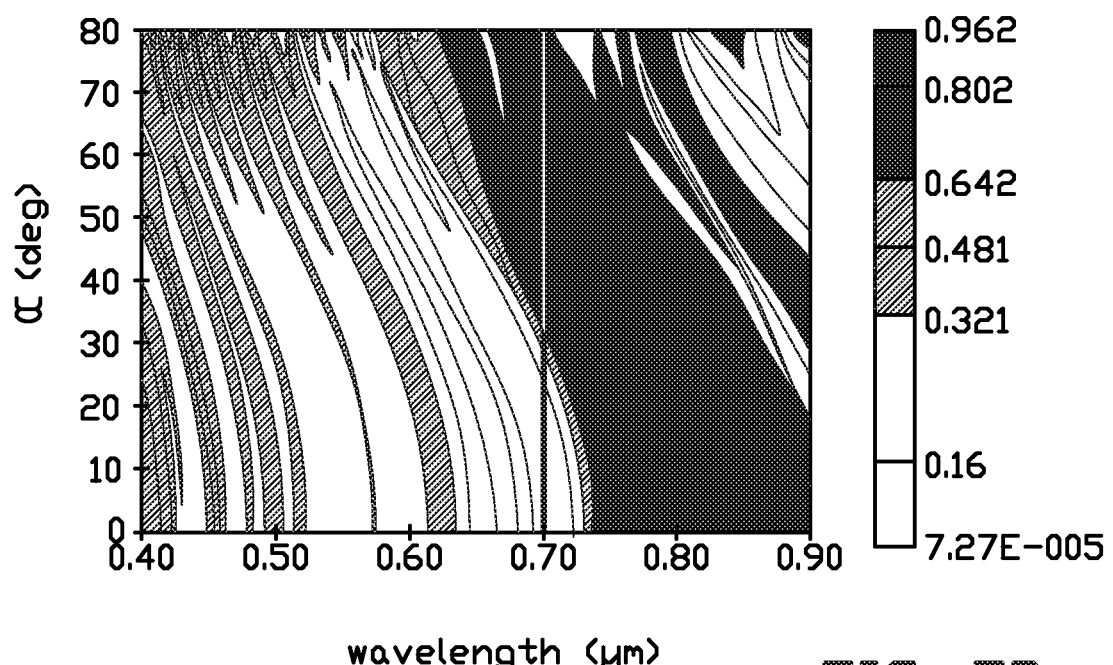
FIG. 5B shows a simulation of the reflectivity of said photonic layer of FIG. 5A.

FIG. 5A shows an example a photonic layer comprising a stack of thirteen dielectric layer pairs, each layer pair comprising a dielectric layer of SiN and a dielectric layer of $SiO_2$. The layer thicknesses of the various dielectric layers are shown in FIG. 5A. FIG. 5B shows a simulation of the reflectivity of said photonic layer of FIG. 5A. As shown in the simulation, the photonic layer is substantially transparent for light with a wavelength below approximately 700 nm, and in the wavelength range between approximately 700 nm and approximately 735 nm, the photonic layer is substantially transparent for light beams with a low angle of incident and is substantially reflective for light beams with a large angle of incident. So according to the simulation, the dielectric thin film stack as defined in FIG. 5A provides the desired properties to a certain extend.

It is noted that dielectric thin film structures offer a lot of freedom for optimization of the angle-selective emission. Accordingly, it is very likely that more complex photonic layers with more dielectric layers and/or more than two dielectric layer materials can produce a photonic layer with optical properties which are even more in accordance with the theoretical picture of FIG. 4.

FIG. 6 schematically shows an example of photovoltaic solar power plant assembly which is comparable to the setup of the above-mentioned third example. The photovoltaic solar power plant 80 comprises several arrays of photovoltaic solar modules 81, and optical structures 82 for redirecting light. The photovoltaic solar modules 81 are vertically mounted bifacial photovoltaic solar modules which are preferably mounted in along a North-South direction. In between the two adjacent photovoltaic solar modules 81, an optical structure 82 for redirecting light is arranged.

The optical structures 82 for redirecting light comprise a substantially rigid carrier which is molded in a shape so that a photovoltaic solar module surface of the vertically mounted bifacial photovoltaic solar modules and an upward facing side of the part 83 of the optical structure 82 adjacent to photovoltaic solar module surface enclose an acute angle.

The upward facing side of the optical structures 82 for redirecting light are provided with the planar optical waveguide, the photonic layer and the diffuse reflective coating of the example of FIG. 3, wherein the photonic layer is arranged at the upward facing side of the planar optical waveguide.

As shown in FIG. 6, the optical structure 82 for redirecting light is spaced apart from the arrays of photovoltaic solar modules 81. Accordingly, the optical structures 82 provide free space luminescent solar concentrators, wherein the optical structure for redirecting light is configured to provide an angular restriction of the light emitted by the optical structures 82, and wherein the optical structures 82 are shaped and arranged with respect to the arrays of photovoltaic solar modules 81, so that the angular restricted emission is substantially directed towards said arrays of photovoltaic solar modules 81.

Figure 7:
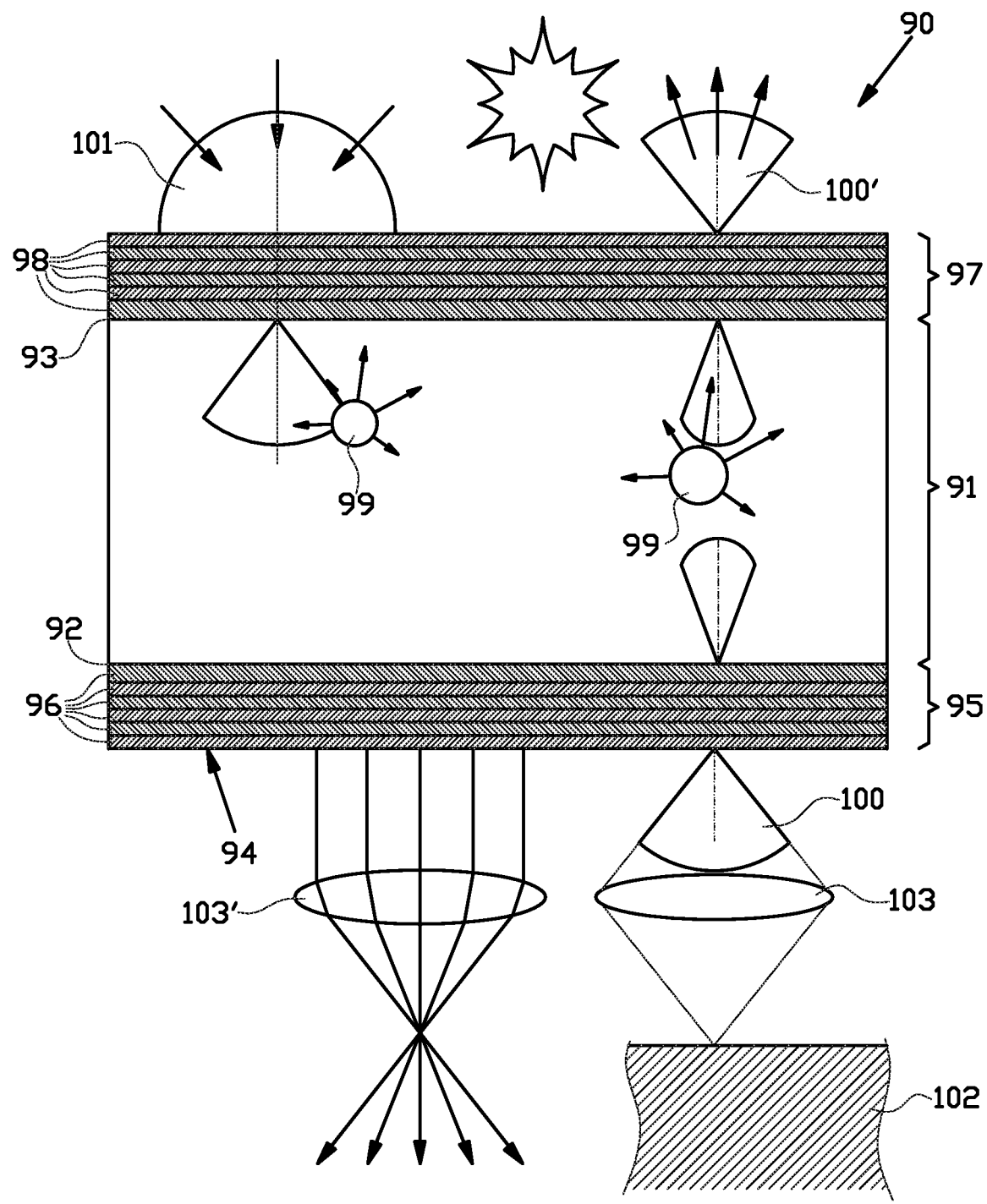
FIG. 7 schematically shows a cross-section of an example of a luminescent solar concentrator which is used in transmission.

FIG. 7 schematically shows a cross-section of an alternative example of an optical structure according to the present invention which provides luminescent solar concentrator 90 which is used in transmission.

The optical structure according to this example comprises a planar optical waveguide 91, having a first planar waveguide surface 92 and second planar waveguide surface 93 which are substantially parallel to each other. Said first planar waveguide surface 92 extends substantially parallel to a redirected light emitting surface 94.

The first planar waveguide surface 92 is covered by a first photonic layer 95. The first photonic layer 95 comprises a dielectric surface coating, in particular a stack of dielectric thin films 96 of two or more high refractive index materials. Preferably, the first photonic layer 95 is configured to provide a reflectivity which at least approaches the theoretical example of FIG. 4, for example having a reflectivity in accordance with the example of FIG. 5B.

The second planar waveguide surface 93 is covered by a second photonic layer 97. The second photonic layer 97 also comprises a dielectric surface coating, in particular a stack of dielectric thin films 98 of two or more high refractive index materials. The second photonic layer 97 may be configured:
  to provide a reflectivity which at least approaches the theoretical example of FIG. 4, for example having a reflectivity in accordance with the example of FIG. 5B, or
  to provide a layer which is substantially transparent for low wavelengths, for example below 700 nm, and which is substantially reflective for high wavelengths, for example above 700 nm, a layer substantially without an angular restriction of the emission at high wavelengths, for example above 700 nm.

Inside the planar optical waveguide 91, luminescent material 99 is arranged, which luminescent material 99 of this example is configured to substantially absorb light with a wavelength below 700 nm, and to substantially emit light with a wavelength above 700 nm. In addition, the planar optical waveguide 91 may also be provided with particles of a light scattering material.

Accordingly, from the light with a wavelength above 700 nm, as emitted by the luminescent material 99, the light with an angle of incident of about 25 degrees or smaller can exit the redirected light emitting surface 94, which results in an angular restriction of the emitted light with a wavelength above 700 nm to the directions of the escape cone 100 as indicated in FIG. 7.

When the second planar waveguide surface 93 is provided with the second photonic layer 97 as the first planar waveguide surface 92, ten there will also be an angular restriction of the emitted light with a wavelength above 700 nm to the directions of the escape cone 100' at a side of the waveguide 91 facing away from the redirected light emitting surface 94, as indicated in FIG. 7. In case the second planar waveguide surface 93 is provided with a photonic layer 97 which is substantially reflective for substantially all angles of incident for wavelengths above 700 nm, there will be substantially no light with a wavelength above 700 nm emitted at the side of the waveguide 91 facing away from the redirected light emitting surface 94.

Since the second photonic layer 97 is substantially transparent for light with a wavelength below 700 nm, there is no angular restriction and light with a wavelength below 700 nm coming from all directions in het hemisphere 101 above the second photonic layer 97 can at least partially pass through the second photonic layer 97 into the waveguide 91.

It is noted that since the first photonic layer 95 is also substantially transparent for light with a wavelength below 700 nm. So direct sun light with a wavelength below 700 nm may at least partially pass through the optical structure 90 onto the photovoltaic solar cells of the photovoltaic solar module 102 which is arranged adjacent the optical structure 90.

It is further noted that the optical structure 90 for redirecting light may also comprise a lens array 103, 103', preferably an array of Fresnel lenses, which is arranged such that the redirected light emitting surface 94 is arranged in between the planar optical waveguide 91 and the lens array 103, 103'. The lens array 103, 103' is configured to concentrate the redirected light 100 onto photovoltaic solar modules 102.

Figure 8A:
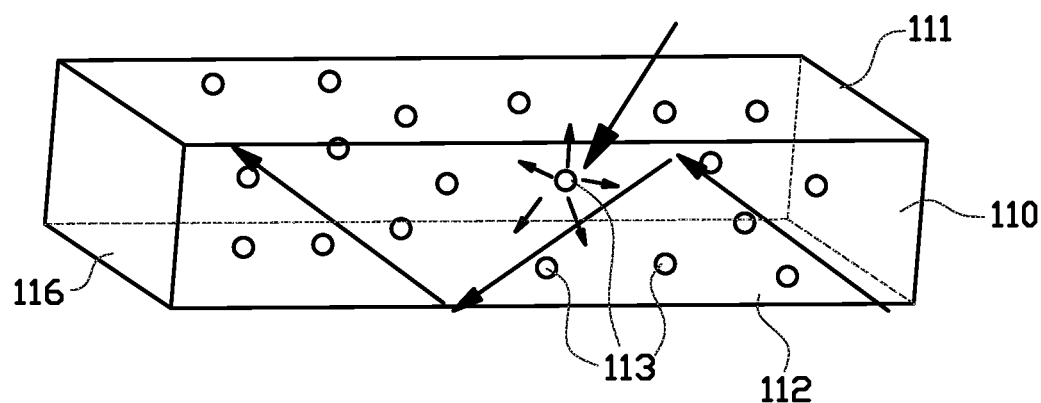
FIGS. 8A, 8B and 8C schematically show the characteristics of the various layers of a further example of an optical structure for redirecting light for use in a photovoltaic solar power plant assembly according to the invention.
Figure 8B:
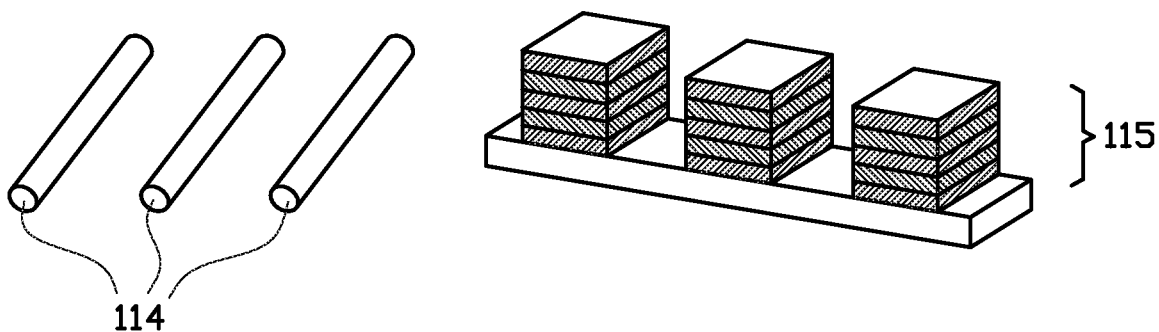
Figure 8C:
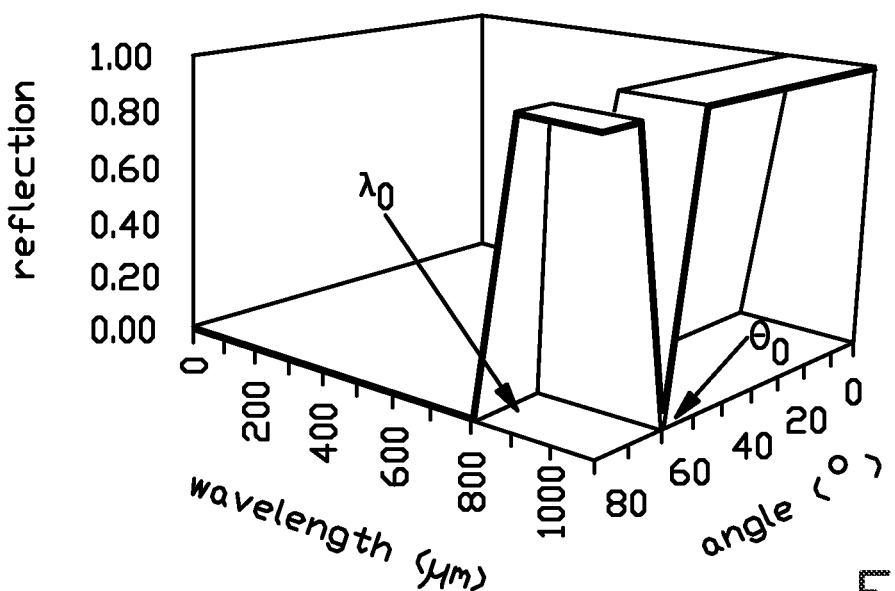

FIGS. 8A, 8B and 8C schematically show the characteristics of the various layers of a further example of an optical structure for redirecting light for use in a photovoltaic solar power plant assembly according to the invention.

The optical structure again comprises a planar optical waveguide 110, having a first planar waveguide surface 111 and second planar waveguide surface 112 which are substantially parallel to each other, as depicted in FIG. 8A. Inside the planar optical waveguide 110, luminescent material 113 is arranged, which luminescent material 113 of this example is configured to substantially absorb light with a wavelength below 850 nm, and to substantially emit light with a wavelength above 850 nm. Preferably, the circumferential edges 116 of the planar optical waveguide 110 is provided with a reflective coating.

At least said first planar waveguide surface 111 is covered by a photonic layer, which may comprise an array of plasmonic resonators 114 and/or an array of dielectric photonic crystals 115, as schematically shown in FIG. 8B, which are configured to provide a desired reflection as presented in FIG. 8C.

The second planar waveguide surface 112 may be covered by a diffuse reflective coating, as in the example of FIG. 3, or with a photonic layer, as in the example of FIG. 7. In the latter case, the planar optical waveguide 110 may also be provided with light scattering material.

Figure 9:
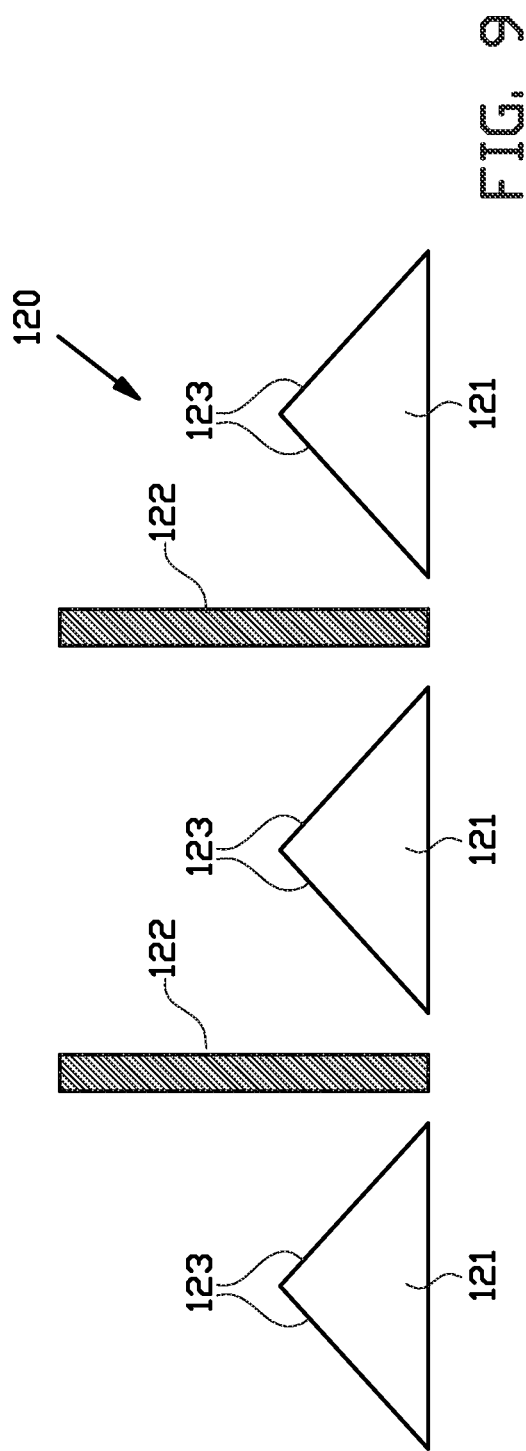
FIG. 9 schematically shows a first example of a photovoltaic solar power plant assembly with a sculptured optical structure for redirecting light.

FIG. 9 schematically shows a first example of a photovoltaic solar power plant 120 assembly with a sculptured optical structure 121 for redirecting light onto vertically mounted bifacial photovoltaic solar modules 122.

Figure 10:
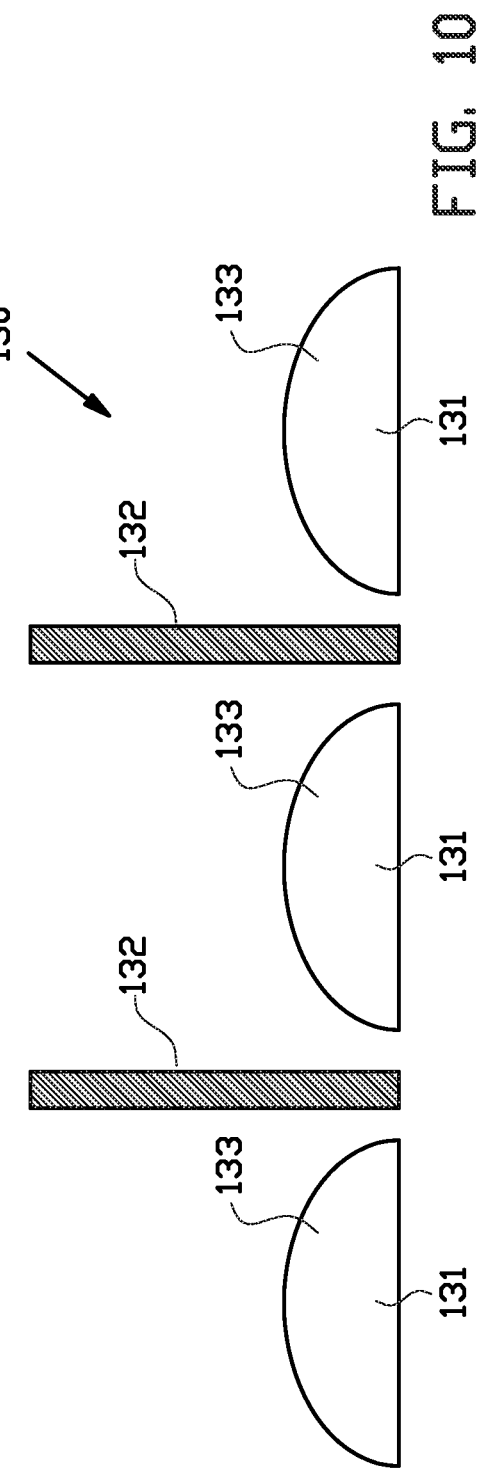
FIG. 10 schematically shows a second example of a photovoltaic solar power plant assembly with a sculptured optical structure for redirecting light.

FIG. 10 schematically shows a second example of a photovoltaic solar power plant 130 assembly with a sculptured optical structure 131 for redirecting light onto vertically mounted bifacial photovoltaic solar modules 132.

The optical structures 121, 131 for redirecting light comprising redirected light emitting surface 123, 133, which are arranged at an upward facing side of the sculptured optical structures 121, 131. The optical structures 121, 131 for redirecting light comprises a diffuse reflective layer which is arranged at said redirected light emitting surface 123, 133. Alternatively, the optical structures 121, 131 for redirecting light are provided with the planar optical waveguide, the photonic layer and the diffuse reflective coating of the example of FIG. 3, which are arranged at said redirected light emitting surface 123, 133

In the first example of FIG. 9, the sculptured optical structures 121 comprise a substantially rigid carrier which is made from a polymer material, preferably comprising one or more of polytetrafluoroethylene (PTFE), polyethylene, polypropylene, polystyrene, polyvinyl-chloride, and polyurethane, and which is sculpted into shape with a triangular cross-section as shown in FIG. 9.

In the second example of FIG. 10, the sculptured optical structures 131 comprise a substantially rigid carrier which is also made from a polymer material, preferably comprising one or more of polytetrafluoroethylene (PTFE), polyethylene, polypropylene, polystyrene, polyvinyl-chloride, and polyurethane, and which is sculpted into shape with a arch-shaped cross-section as shown in FIG. 10.

Both construction 121, 131 are relatively light-weighed and can be easily transported and handled when constructing a photovoltaic solar plant assembly according to the invention.

Furthermore, said redirected light emitting surfaces 123, 133 may be provided with an anti-soiling surface, preferably a hydrophobic surface. Preferably, said hydrophobic surface comprises a coating of fluorinated polymers and/or hydrophobic nanostructures.

It is to be understood that the above description is included to illustrate the operation of the preferred embodiments and is not meant to limit the scope of the invention. From the above discussion, many variations will be apparent to one skilled in the art that would yet be encompassed by the scope of the present invention.

In summary, the invention relates to a photovoltaic solar power plant assembly and a method of using said assembly to generate power. The assembly comprises an array of photovoltaic solar modules arranged in a solar module surface, and an optical structure for redirecting light towards said solar module surface, comprising a redirected light emitting surface. The optical structure comprises:
- a planar optical waveguide which comprises a parallel first and second planar waveguide surfaces, wherein said first planar waveguide surface extends parallel to said redirected light emitting surface, wherein said first planar waveguide surface is at least partially covered by a photonic layer which is configured to provide an angular restriction of a light emission from the planar waveguide through said redirected light emitting surface, and
- a light scattering and/or luminescent material, which material is arranged as particles in the planar optical waveguide and/or in a layer which at least partially covers said second planar waveguide surface.

The invention claimed is:

1. A photovoltaic solar power plant assembly comprising an array of photovoltaic solar modules arranged in a photovoltaic solar module surface, and an optical structure for redirecting light comprising a redirected light emitting surface, wherein the optical structure for redirecting light comprises:
   a planar optical waveguide, wherein the planar optical waveguide comprises:
   a first and second planar waveguide surface which are substantially parallel to each other, and
   a peripheral edge,
   wherein said first planar waveguide surface extends substantially parallel to said redirected light emitting surface, wherein said first planar waveguide surface is at least partially covered by a photonic layer, wherein said photonic layer is configured to provide an angular restriction of a light emission from the planar optical waveguide through said redirected light emitting surface, and
   a light scattering and/or luminescent material, which light scattering and/or luminescent material is arranged as particles in the planar optical waveguide and/or in a layer which at least partially covers said second planar waveguide surface,
   wherein the photovoltaic solar module surface and the redirected light emitting surface are arranged so that the redirected light emitting surface is facing the photovoltaic solar module surface so that the angular restricted light emission from the planar optical waveguide can be directed towards the photovoltaic solar module surface,
   wherein the photonic layer comprises a dielectric surface coating, and wherein the dielectric surface coating is configured to provide the angular restriction for light with a wavelength above a predetermined wavelength wherein the optical structure for redirecting light comprises a reflective coating which is arranged to cover the second planar waveguide surface of the planar optical waveguide, and wherein, at least in use, the second planar waveguide surface is arranged at a side facing away from the photovoltaic solar module surface and the sun.

2. The photovoltaic solar power plant assembly according to claim 1, wherein the dielectric surface coating is configured to be transparent for light inside said planar waveguide with an angle of incidence on the dielectric surface coating below 50 degrees.

3. The photovoltaic solar power plant assembly according to claim 1, wherein the dielectric surface coating is configured to be transparent for light with a wavelength below the predetermined wavelength.

4. The photovoltaic solar power plant assembly according to claim 1, wherein the photonic layer is configured to provide no angular restriction for light with a wavelength below said predetermined wavelength to at least partially pass through the photonic layer into the planar optical waveguide.

5. The photovoltaic solar power plant assembly according to claim 1, wherein the luminescent material is configured to emit light with a wavelength above 700 nm when irradiated with sun light.

6. The photovoltaic solar power plant assembly according to claim 1, wherein the light scattering and/or luminescent material comprises quantum dots, nanocrystals, dyes or pigments, wherein the quantum dots, nanocrystals, dyes or pigments, are configured to emit light with a wavelength above 700 nm when irradiated with sun light.

7. The photovoltaic solar power plant assembly according to claim 1, wherein the optical structure for redirecting light comprises the reflective coating which is arranged to at least partially cover the peripheral edge of the planar optical waveguide.

8. The photovoltaic solar power plant assembly according to claim 1, wherein the optical structure for redirecting light comprises a lens array, wherein the lens array is arranged such that the redirected light emitting surface is arranged in between the planar optical waveguide and the lens array, and/or wherein the lens array is configured to concentrate the redirected light onto photovoltaic solar modules.

9. The photovoltaic solar power plant assembly according to claim 1, wherein the optical structure for redirecting light comprises a substantially rigid carrier.

10. The photovoltaic solar power plant assembly according to claim 9, wherein said substantially rigid carrier comprises a polymer material, preferably comprising one or more of polytetrafluoroethylene (PTFE), polyethylene, polypropylene, polystyrene, polyvinyl-chloride, and polyurethane.

11. The photovoltaic solar power plant assembly according to claim 1, wherein the light scattering material is arranged in a light scattering layer which at least partially covers said second planar waveguide surface, wherein said light scattering layer comprises:
   organic or inorganic diffusers,
   quantum dots,
   nanocrystals,
   dyes or pigments, and/or
   nano or micro textures.

12. The photovoltaic solar power plant assembly according to claim 1, wherein at least said redirected light emitting surface comprises an anti-soiling surface and/or a hydrophobic surface.

13. A method of converting solar energy into electrical power using a photovoltaic solar power plant assembly according to claim 1.

14. The photovoltaic solar power plant assembly according to claim 1, wherein the dielectric surface coating comprises a dielectric thin film stack.

15. The photovoltaic solar power plant assembly according to claim 1, wherein said predetermined wavelength is a wavelength in a range from 700 to 900 nm.

16. A photovoltaic solar power plant assembly comprising an array of photovoltaic solar modules arranged in a photovoltaic solar module surface, and an optical structure for redirecting light comprising a redirected light emitting surface, wherein the optical structure for redirecting light comprises:
   a planar optical waveguide, wherein the planar optical waveguide comprises:
   a first and second planar waveguide surface which are substantially parallel to each other, and
   a peripheral edge,
   wherein said first planar waveguide surface extends substantially parallel to said redirected light emitting surface, wherein said first planar waveguide surface is at least partially covered by a photonic layer, wherein said photonic layer is configured to provide an angular restriction of a light emission from the planar optical waveguide through said redirected light emitting surface, and
      a light scattering and/or luminescent material, which light scattering and/or luminescent material is arranged as particles in the planar optical waveguide and/or in a layer which at least partially covers said second planar waveguide surface,
   wherein the photovoltaic solar module surface and the redirected light emitting surface are arranged so that the redirected light emitting surface is facing the photovoltaic solar module surface so that the angular restricted light emission from the planar optical waveguide can be directed towards the photovoltaic solar module surface, and
   wherein the optical structure for redirecting light comprises a reflective coating which is arranged to cover the second planar waveguide surface of the planar optical waveguide, and wherein, at least in use, the second planar waveguide surface is arranged at a side facing away from the photovoltaic solar module surface and the sun.

* * * * *